United States Patent
Namiki et al.

[11] Patent Number: 5,951,835
[45] Date of Patent: Sep. 14, 1999

[54] CONTINUOUS VACUUM PROCESSING APPARATUS

[75] Inventors: Shigeru Namiki, Kadomashi; Hatsuhiko Shibasaki, Ibaragishi; Tadaomi Amano, Osakashi; Katsuyuki Kita, Katanoshi; Akira Okuda, Sakaishi, all of Japan

[73] Assignee: Matsushita Electric Industrial Co., Ltd., Osaka, Japan

[21] Appl. No.: 08/816,861

[22] Filed: Mar. 13, 1997

[30] Foreign Application Priority Data

Mar. 18, 1996 [JP] Japan .................................. 8-061021

[51] Int. Cl.$^6$ .................................................. C23C 14/56
[52] U.S. Cl. ............................. 204/298.24; 204/298.25; 118/718; 118/719
[58] Field of Search ..................... 204/298.24, 298.25; 118/718, 719

[56] References Cited

U.S. PATENT DOCUMENTS 3,294,670 12/1966 Charschan et al. ................. 204/298.25
4,693,803 9/1987 Casey et al. ....................... 204/298.24
5,088,908 2/1992 Ezaki et al. ............................ 118/718

FOREIGN PATENT DOCUMENTS 688235 3/1994 Japan .

*Primary Examiner*—Nam Nguyen
*Assistant Examiner*—Rodney G. McDonald
*Attorney, Agent, or Firm*—Price,Gess & Ubell

[57] ABSTRACT

More than two pressure reducing chambers 6 to 9 are located on both the upstream and the downstream of vacuum processing housings 11 and 12. Each of the pressure reducing chambers 6 to 9 includes a film conveying means 30, a vacuum exhausting means, and a gate valve 20 provided with a resilient member for closely holding down the running film 1 to seal off the vacuum state of a belt-like passage of the gate valve 20. As the pressure reducing chambers 6 to 9 are protected with their specific gate valve belt-like passage arrangement from reduction of the vacuum state and located respectively on the upstream and downstream sides of the vacuum processing units 11 and 12, the vacuum state in the continuous vacuum processing apparatus will be maintained to a desired level. While the running film 1 is being conveyed, the gate valves 20 at the first and second stages are actuated alternately for opening and closing after vacuum evacuation.

13 Claims, 9 Drawing Sheets

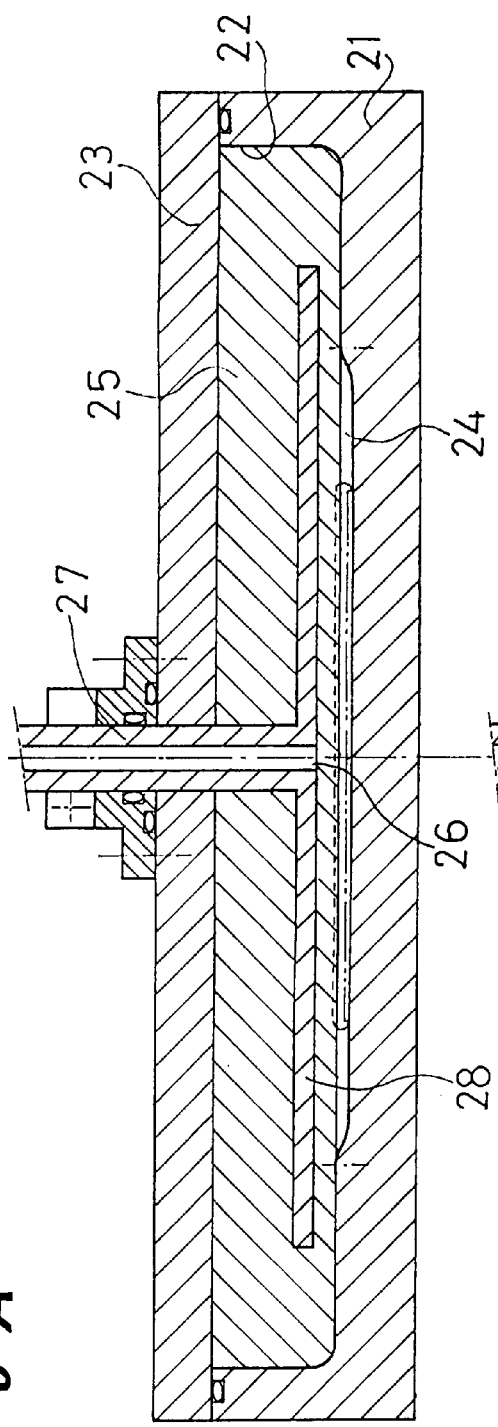
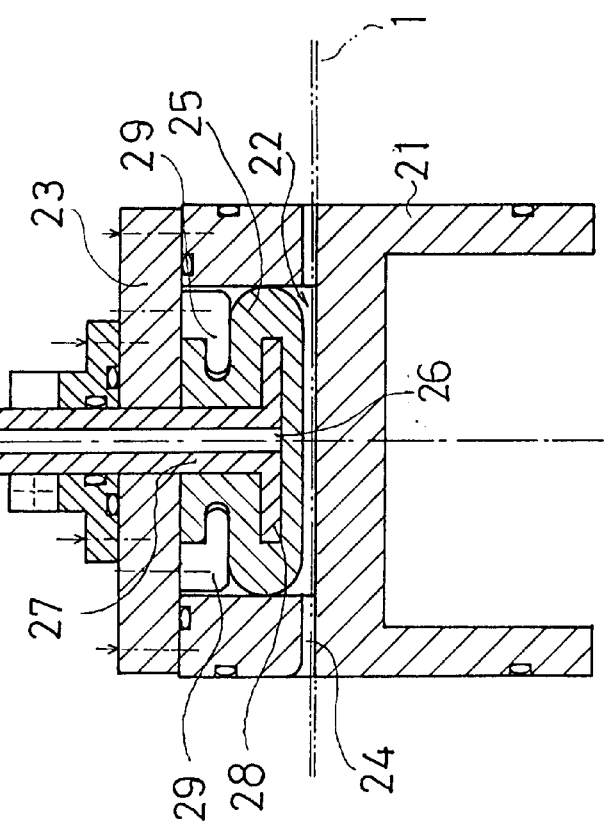
Fig. 5A
Fig. 5B

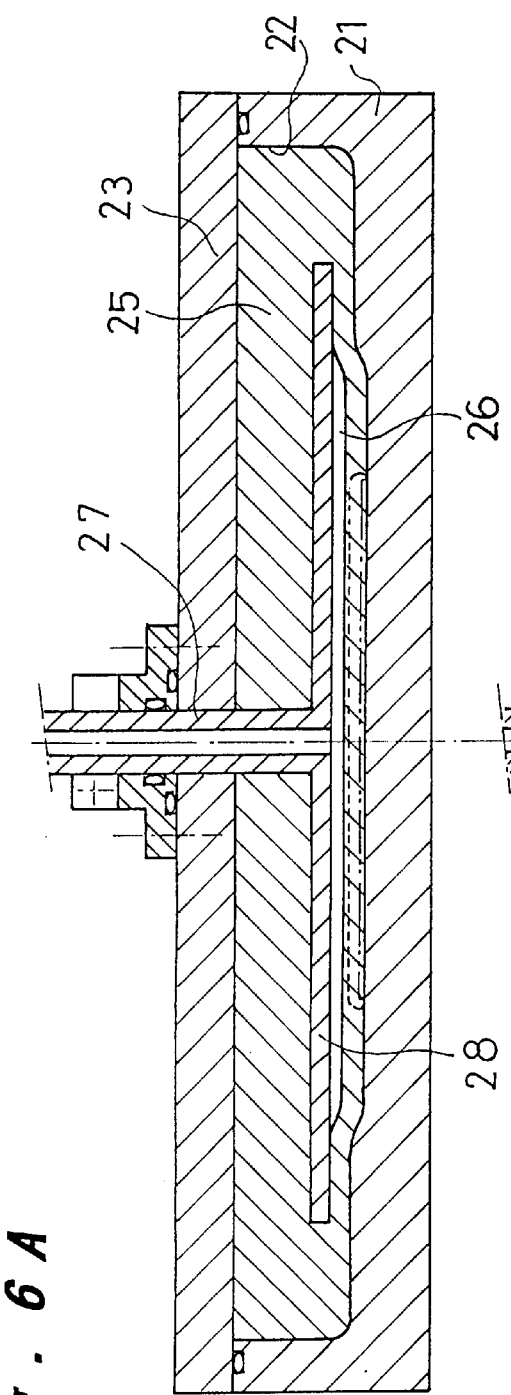
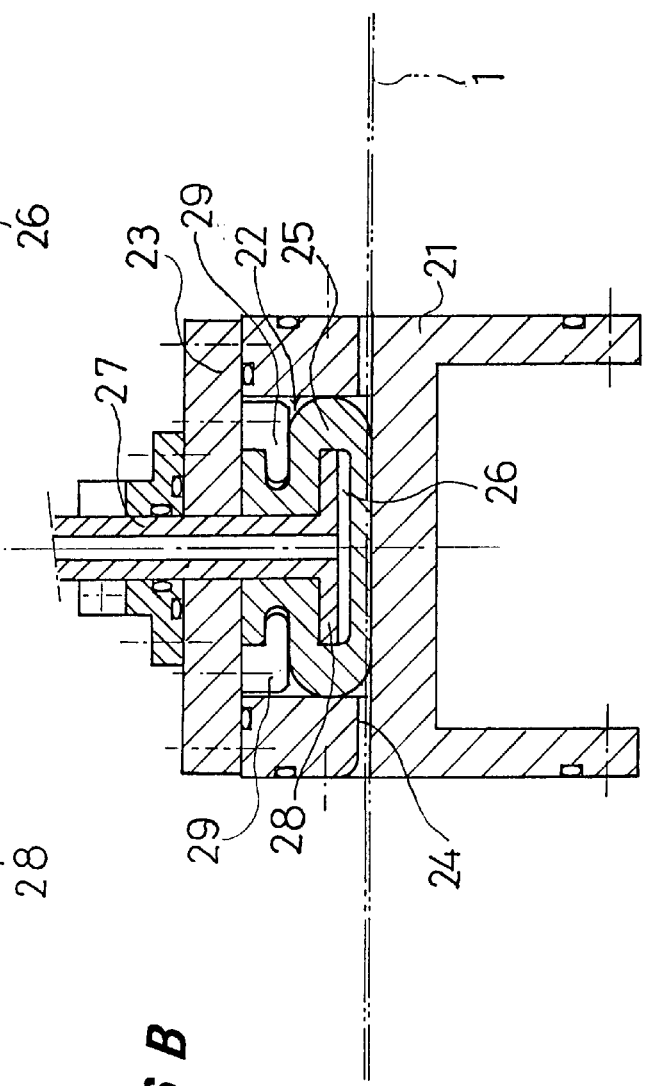
Fig. 6A
Fig. 6B

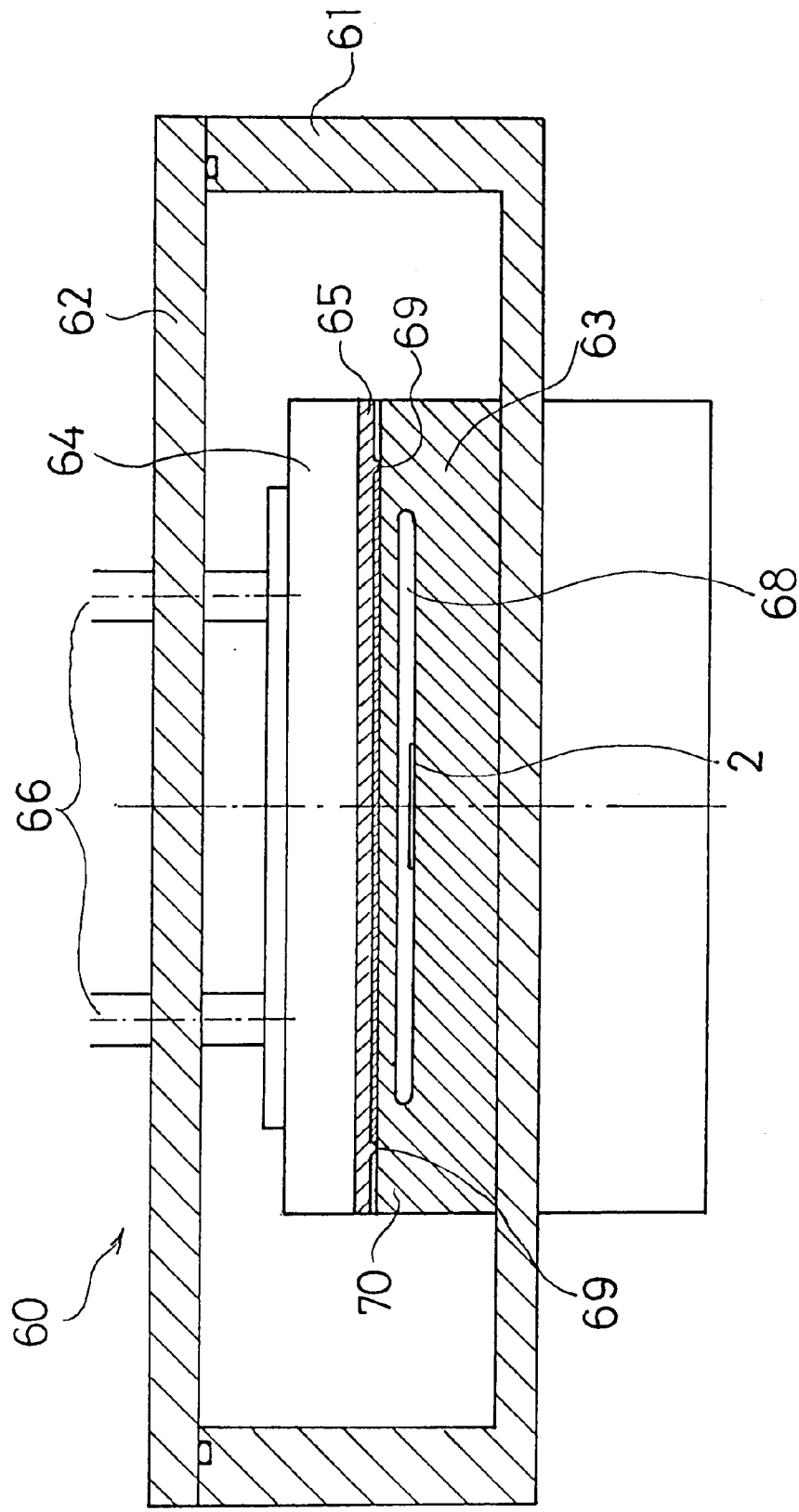

CONTINUOUS VACUUM PROCESSING APPARATUS

BACKGROUND OF THE INVENTION

1. Technical Field of the Invention

The present invention relates to a continuous vacuum processing apparatus for forming layers on workpieces to continuously produce components such as ceramic oscillators.

2. Description of Related Art

Components such as ceramic oscillators have been commonly produced by a batch-mode electrode layer-forming method which is low in productivity and unfavorable for mass-production.

A film deposition method using continuous vacuum processing has higher productivity, and thus various apparatuses of such kind have been proposed. Among them is a multi-stage differential pressure apparatus disclosed in Japanese Published Unexamined Patent Application 6-88235 (1994), in which a sheet of thin steel is held and conveyed by a plurality of seal rollers for the continuous vacuum processing.

One of conventional continuous vacuum processing apparatuses will be explained referring to FIG. 11. As shown, there are provided a running film 71, a supply reel 72, a take-up reel 73, and guide rolls 74. A vacuum sealing assembly denoted as 75 comprises a casing 76, a seal roll 77, and seal bars 78 to 83. A group of pressure reducing compartments 84 to 88 from the first to fifth stages are formed between the seal roll 77 and the seal bars 78 to 83. The compartments 84 to 88 are decompressed in stages by a vacuum exhausting unit 90 connected thereto by a vacuum conduit 89. Also provided are an evaporation chamber 91, a cooling roll 92, and an evaporation device 93.

The action of the above-described conventional continuous vacuum processing apparatus will now be explained. When the running film 71 is unrolled from the supply reel 72, it passes through the guide roll 74 and the vacuum sealing assembly 75 and is guided into the evaporation chamber 91 for vacuum processing. As the film 71 is wound and runs on the cooling roll 92, it is subjected to evaporation process in the evaporation device 93 before reeled out into the atmosphere. The running film 71 is then guided by the guide roll 74 and taken up by the take-up reel 73.

The above-described conventional apparatus allows the running film to be conveyed at high speed hence contributing to the improvement of the productivity, but creates the following disadvantages when the running film carries a multiplicity of workpieces taped down thereto to be processed.

(1) The thickness of the running film varies depending on either the presence or absence and the size of workpieces on the running film. This increases the gap for sealing and makes the reduction of pressure to a vacuum difficult.

(2) The apparatus comprises a multiple of rollers, making the construction complex, especially in the sealing part.

(3) Hence, the whole apparatus and its vacuum exhaust units will hardly be minimized in the dimensions.

SUMMARY OF THE INVENTION

In view of the foregoing, it is an object of the present invention to provide a compact and simply constructed continuous vacuum processing apparatus capable of successfully performing vacuum process even when the workpieces to be processed are taped down on a running film.

To accomplish the said object, a continuous vacuum processing apparatus for continuously vacuum processing a row of workpieces taped down on a running film, according to the present invention, comprises more than two pressure reducing chambers located in series on both the upstream and the downstream of a vacuum processing unit respectively. Each of the pressure reducing chamber includes a film conveying means, a vacuum exhausting means, and a gate valve provided with a resilient member for closely holding down the running film to seal off a vacuum state of a belt-like passage of the gate valve. Accordingly, the vacuum state in the continuous vacuum processing apparatus will be maintained to a desired level. While the running film is being conveyed by the film conveying means of the pressure reducing chambers, one pair of the gate valves at the first and second stages are actuated alternately for opening and closing after vacuum evacuation, hence ensuring a high level of vacuum state.

The resilient member in the gate valve for sealing may have a pressurizing space provided in the interior thereof for introducing a pressurized fluid and is arranged to face the passage of the running film. The passage will easily be closed and opened by introducing and discharging the pressurized fluid.

The gate valve may comprise a lower valve member composed of two regions, one located at an entrance side through which the passage for the running film passes and the other located at the opposite side on which the passage extends, and provided with a projection formed between the two regions, an upper valve member arranged movable vertically with respect to the lower valve member so that its lower side opposes to the other region of the lower valve member and an upper side of the projection, and the resilient member mounted to a lower side of the upper valve member. This allows the passage to be closed and opened by the vertical movement of the upper valve member. Also, when the one region of the lower valve member is sealed, the sealing between the upper and lower valve members will be maintained.

The resilient member may have a rib portion provided on a lower side thereof which is arranged to face the passage, and a cross section of the rib may be shaped smaller than an interval of any two adjacent workpieces taped down on the running film. When the rib portion of the resilient member is lowered to between the two adjacent workpieces on the running film, the workpieces will be protected from any stress during the sealing action.

By providing two or more vacuum processing units in a row, it becomes possible to vacuum process both sides of the workpieces on the running film in sequence. The vacuum processing unit may contain a plurality of sputtering devices so that multiple layers can be developed at one time.

BRIEF DESCRIPTION OF THE DRAWINGS

FIGS. 5A and 5B are a longitudinal side elevation view and a longitudinal front view of a gate valve in the embodiment;

FIGS. 6A and 6B are a longitudinal side elevation view and a longitudinal front view of the gate valve in action;

FIG. 9 is a cross sectional view taken along the line A—A of FIG. 8;

DETAILED DESCRIPTION OF THE INVENTION

One embodiment of a continuous vacuum processing apparatus according to the present invention will be described referring to FIGS. 1 to 7.

Figure 1:
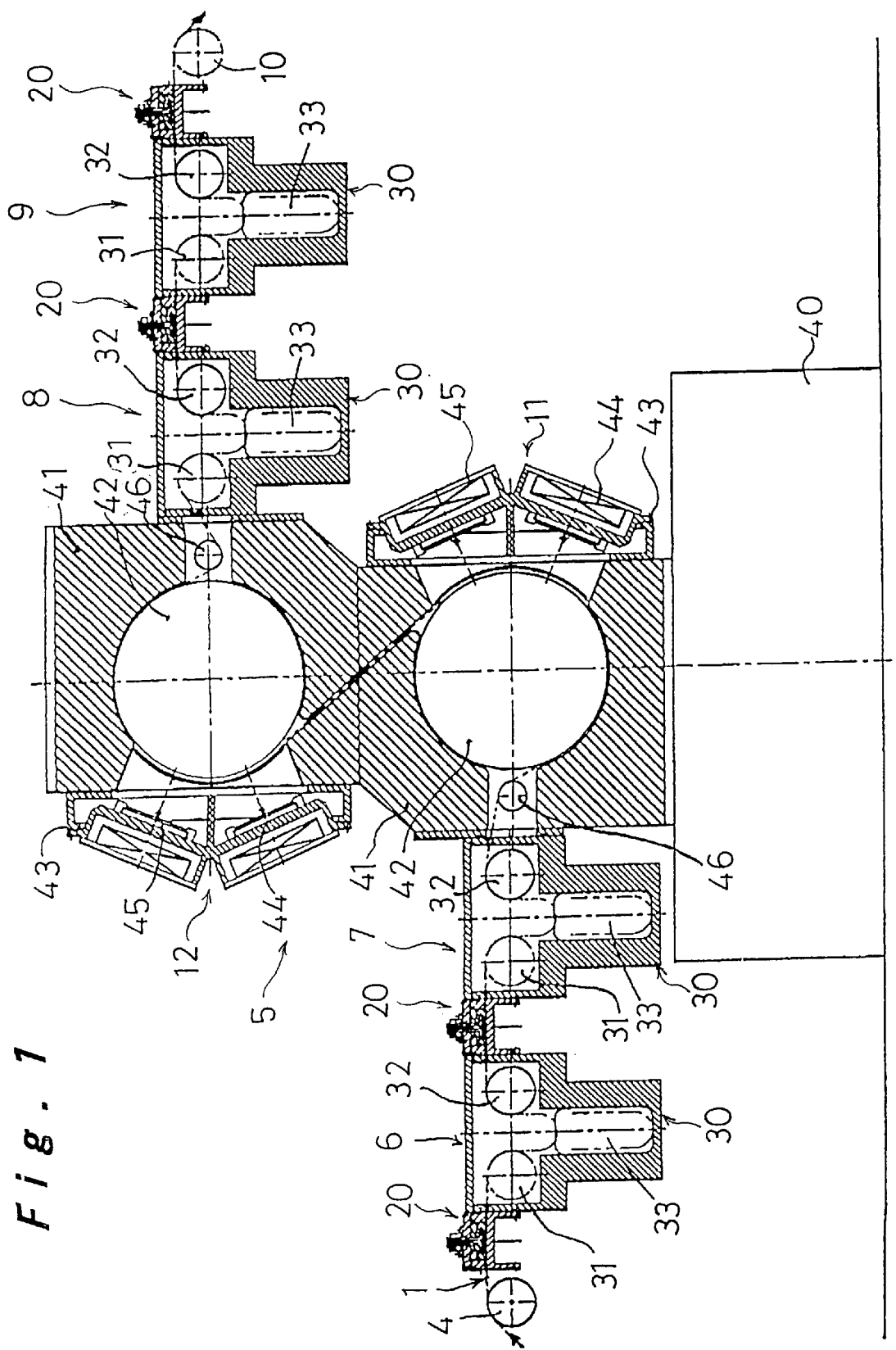
FIG. 1 is a longitudinal sectional view of the entire arrangement of a continuous vacuum processing apparatus showing one embodiment of the present invention.
Figure 2:
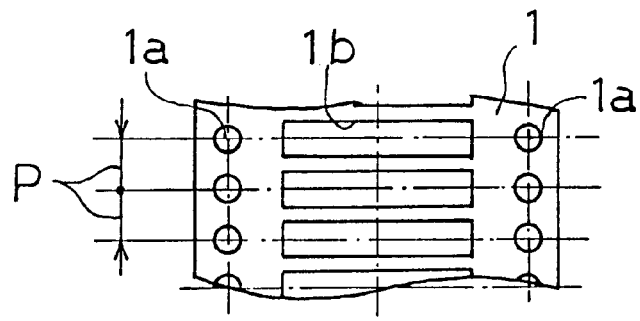
FIG. 2 is a plan view showing a base material of a running film in the embodiment.
Figure 3:
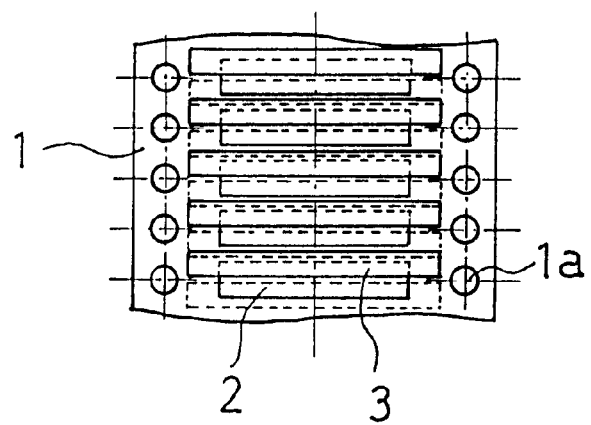
FIG. 3 is a plan view of the running film in the embodiment.
Figure 4:
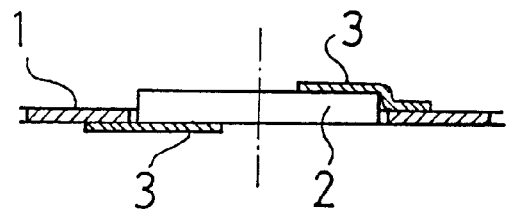
FIG. 4 is an enlarged longitudinal side elevation view of the running film in the embodiment.

A running film denoted as 1 is shown in FIG. 1 and its details are explained in FIGS. 2 to 4. The running film 1 has two rows of perforations 1a provided at equal intervals of a pitch P in both sides thereof, and a row of apertures 1b provided in the center thereof for holding workpieces 2 to be processed. The workpieces 2 are held to the running film or carrier 1 by masking tapes 3 as shown in FIGS. 3 and 4.

Referring to FIG. 1, the running film 1 is guided by a guide roll 4 from a supply reel (not shown) into the continuous vacuum processing apparatus 5. The continuous vacuum processing apparatus 5 comprises a first and a second entrance-side pressure reducing chambers 6, 7, a first and a second exit-side pressure reducing chambers 8, 9, and a first and a second vacuum processing housings 11, 12. The running film 1 reeled out from the continuous vacuum processing apparatus 5 is rewound by a reel-out roll 10 on to a take-up reel (not shown) which is then transferred to the further steps of process.

The pressure reducing chambers 6 to 9 are substantially identical in construction having gate valves 20 and film conveying means 30, and joined to vacuum exhaust units which will be explained later. The gate valve 20 comprises a valve chamber 22 of a top-opened rectangular shape provided in a valve case 21 and airtightly closed at the top with a cover 23, as shown in FIGS. 5 and 6. The valve chamber 22 includes a running passage 24 in the bottom which extends across the valve case 21 for passing the running film 1. A resilient sealer 25 made of soft rubber having a pressurizing space 26 in the center is disposed in the valve chamber 22. By feeding compressed air into the pressurizing space 26, the valve chamber 22 is sealed with the resilient sealer 25 while the running film 1 runs through the running passage 24. There are also provided a compressed air inducing pipe 27, a back plate 28 mounted opposite to the running passage 24 on the side of the pressurizing space 26, and a holding member 29 securing the upper end of the resilient sealer 25 to the cover 23.

Back to FIG. 1, the film conveying means 30 comprises a film forwarding roll 31, a film guide roll 32, and a forwarding control space 33 for forwarding the film 1 intermittently. The film forwarding roll 31 has a group of pins (not shown) for engaging with the perforations 1a of the running film 1 and is linked to a drive mechanism (not shown).

The first and second vacuum processing housings 11, 12 are identical in construction and mounted on a module base 40. Also shown are casings 41, cooling rolls 42, and sputtering chambers or film deposition assembly 43. The sputtering chamber 43 is fixedly mounted to the casing 41 and sealed with an O-ring(s) (not shown). A pair of sputtering devices 44 and 45 are installed in the sputtering chamber 43 for sputtering two different materials over the front or back surface of the running film 1 in two layers. The casings 41 are provided at both the entrance and exit sides with a couple of guide rolls 46 which guide the running film 1 to the cooling rolls 42 and the first exit-side pressure reducing chamber 8.

The cooling rolls 42 and the film forwarding roll 31 in the first exit-side pressure reducing chamber 8 are linked to a drive mechanism (not shown) for rotating in synchronism to produce a constant circumferential speed so that the running film 1 is continuously vacuum processed in the two vacuum processing housings 11 and 12. The film forwarding rolls 31 provided at other pressure reducing chambers 6, 7, and 9 and the reel-out roll 10 at the exit of the pressure reducing chamber 9 are intermittently driven at higher speed than the film forwarding roll 31 of the pressure reducing chamber 8.

Figure 7:
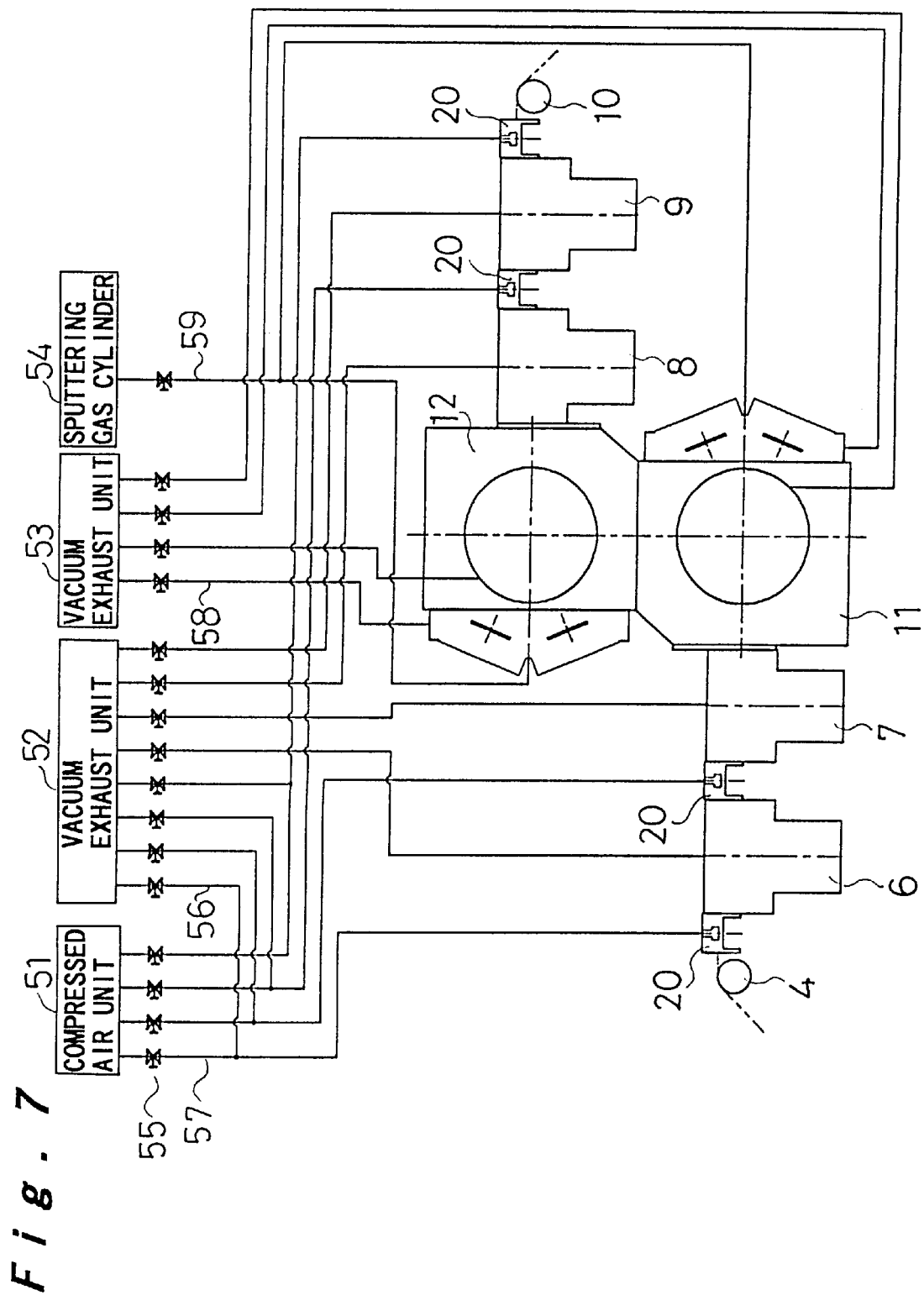
FIG. 7 is a schematic diagram of a pneumatic exhausting circuit in the embodiment.

FIG. 7 illustrates a pneumatic exhausting circuit which incorporates a compressed air unit 51, vacuum exhaust units 52 and 53, a sputtering gas cylinder 54, control valves 55, and pipings 56 to 59. The vacuum exhaust units 52, 53 are independently provided for producing a higher degree of vacuum in the sputtering process. Each of the gate valves 20 is connected to the compressed air unit 51 and the vacuum exhaust unit 52 by their respective control valves 55 for causing the resilient sealer 25 to be properly inflated and deflated.

In the above-described structure, the running film 1 is advanced a predetermined distance by the film forwarding roll 31 of the first entrance-side pressure reducing chamber 6. The running passage 24 of the gate valve 20 in the pressure reducing chamber 6 is at this time opened, as shown in FIG. 5. Meanwhile, the gate valve 20 of the second entrance-side pressure reducing chamber 7 allows its resilient sealer 25 to hold down the running film 1 hence closing the running passage 24 as shown in FIG. 6. After the advancing of the running film 1 into the first entrance-side pressure reducing chamber 6 is completed, the resilient sealer 25 in the gate valve 20 of the pressure reducing chamber 6 presses down the running film 1 and closes the running passage 24, forming a vacuum in the first entrance-side pressure reducing chamber 6.

This is followed by the step of opening the gate valve 20 of the second entrance-side pressure reducing chamber 7. When the running film 1 has been advanced a predetermined distance in the second chamber 7 by the action of the film forwarding roll 31, the gate valve 20 is closed and one cycle of the forwarding operation at the entrance side is completed. In the succeeding cycle, the first entrance-side pressure reducing chamber 6 is returned to the atmospheric pressure by the action of a leak valve (not shown) and its gate valve 20 is opened for allowing the running film 1 to be advanced again by the predetermined distance.

The operation of the first and second vacuum processing housings 11, 12 is now explained which starts with feeding of the running film 1 on to the cooling roll 42 by the action of the guide roll 46. As the running film 1 is running on the cooling roll 42 in the first vacuum processing housing 11, its back surface is subjected to the two-layer sputtering of two different materials by their respective sputtering devices 44 and 45 in the sputtering chamber 43. Equally, when the running film 1 runs on the cooling roll 42 in the second vacuum processing housing 12, its front surface is subjected to the two-layer sputtering of two materials before reeled out at a constant speed via the guide roll 46 to the first exit-side pressure reducing chamber 8 by the action of the film forwarding roll 31. The first and second vacuum processing housings 11, 12 are connected to the vacuum exhaust unit 53 for producing a higher degree of vacuum than the pressure reducing chambers 7 and 8 by means of conductance effect, since the space between the cooling roll 42 and the casing 41 is minimized to as a small distance as permitting the passing of the running film 1.

The running film 1 is then transferred a predetermined distance into the first exit-side pressure reducing chamber 8 and when its gate valve 20 is opened, fed to the second exit-side pressure reducing chamber 9. After the feeding is completed, the gate valve 20 of the first exit-side pressure reducing chamber 8 is closed and the second exit-side pressure reducing chamber 9 is returned to the atmospheric pressure. This is followed by the step of opening the gate valve 20 of the second exit-side pressure reducing chamber 9 and further advancing the running film 1 by the action of the reel-out roll 10 to the next stage of process (not shown). After the length of the running film 1 is reeled out, the gate valve 20 of the second exit-side pressure reducing chamber 9 is closed to be evacuated and returned to its standby state.

The resilient sealers 25 in the gate valves 20 of the embodiment are made of a belt-like shape of the soft rubber thus providing a high sealing effect and allowing the two pressure reducing chambers to seal off at either side, entrance and exit, of the vacuum processing housings 11 and 12. Accordingly, the apparatus will be simplified in the construction and minimized in the overall dimensions. Also, a simple construction of the film conveying means 30 can be employed. The two vacuum processing housings 11 and 12 are provided for processing on both the front and back surfaces of the running film 1 respectively. This allows the workpieces 2 on the film 1 to be vacuum processed at both sides, making it possible to form two. electrodes on both sides of a ceramic element. In addition, each of the vacuum processing housings 11 and 12 can include two or more sputtering devices 44 and 45 for producing multiple layers of evaporation. For example, electrodes of the ceramic element may be composed of a chrome substrate layer and a silver second layer hence increasing the bonding strength to the ceramic base of the element.

Figure 8:
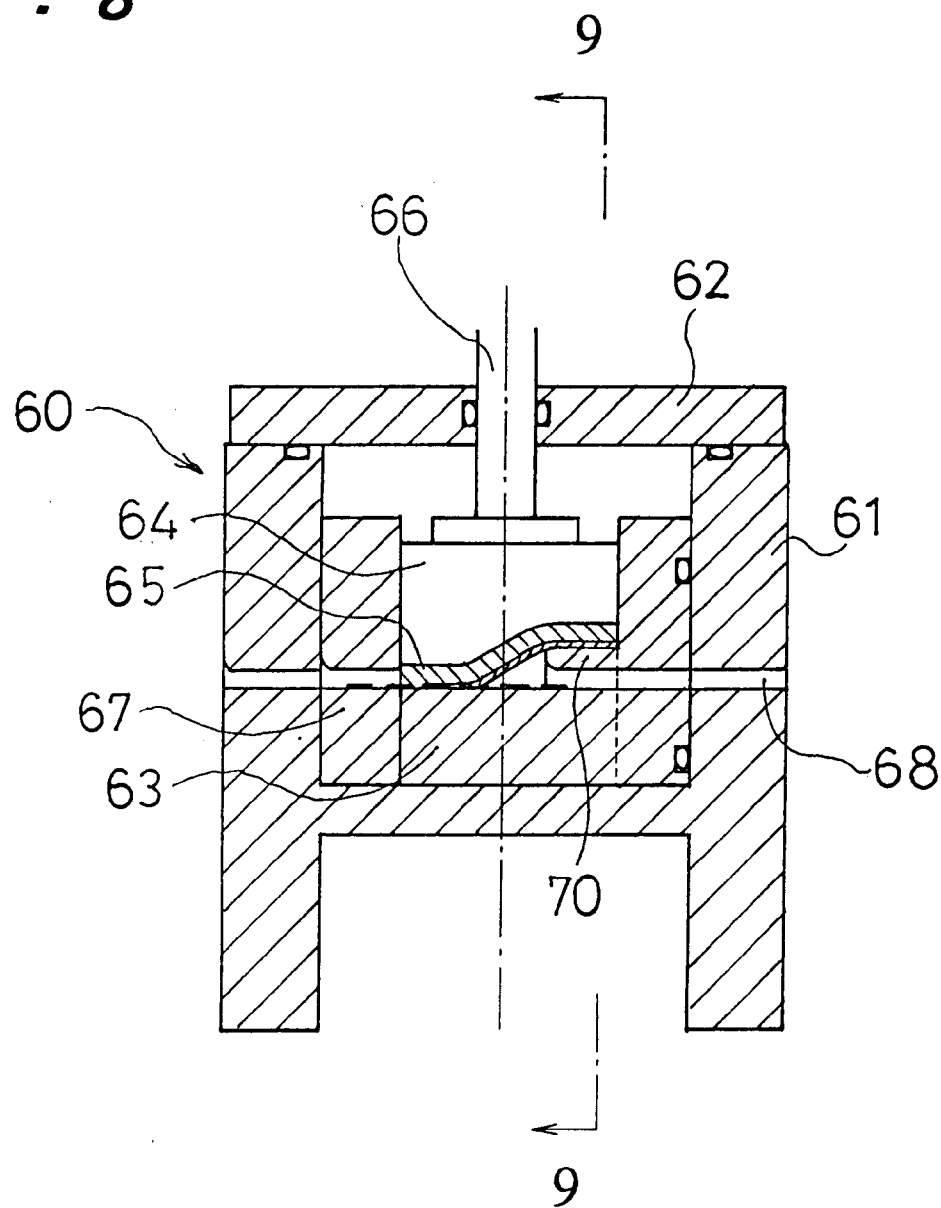
FIG. 8 is a longitudinal front view of a gate valve in a continuous vacuum processing apparatus showing another embodiment of the present invention.
Figure 10A:
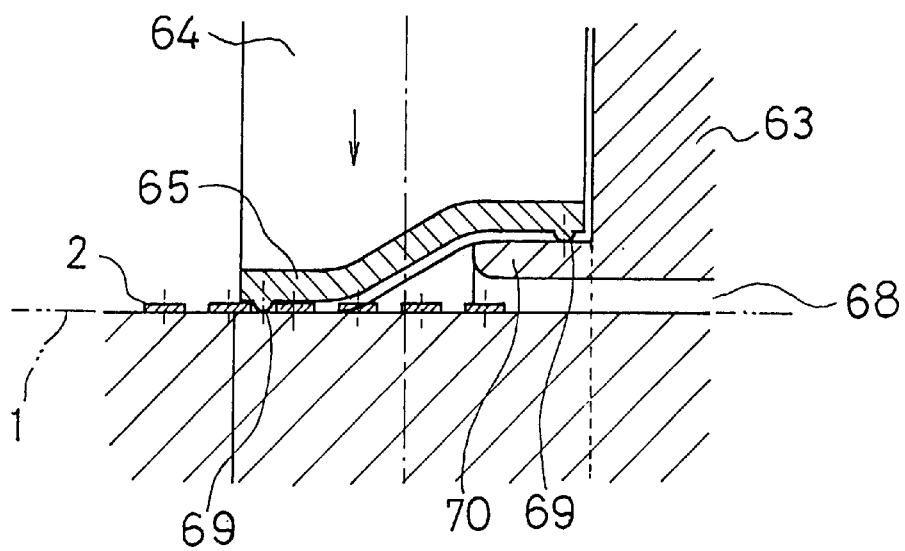
FIGS. 10A and 10B are longitudinal front views of the gate valve of the another embodiment, each showing a closed state and an opened state.
Figure 10B:
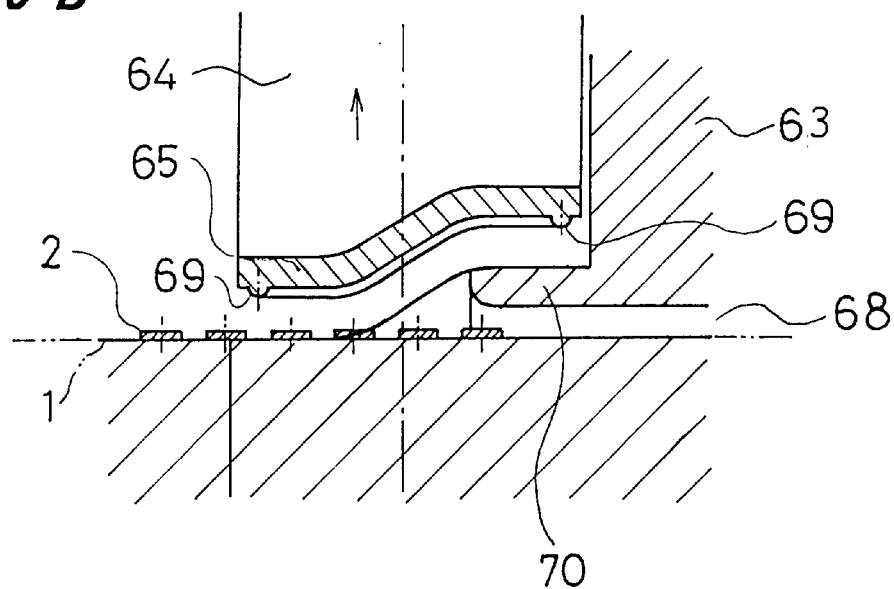
Figure 11:
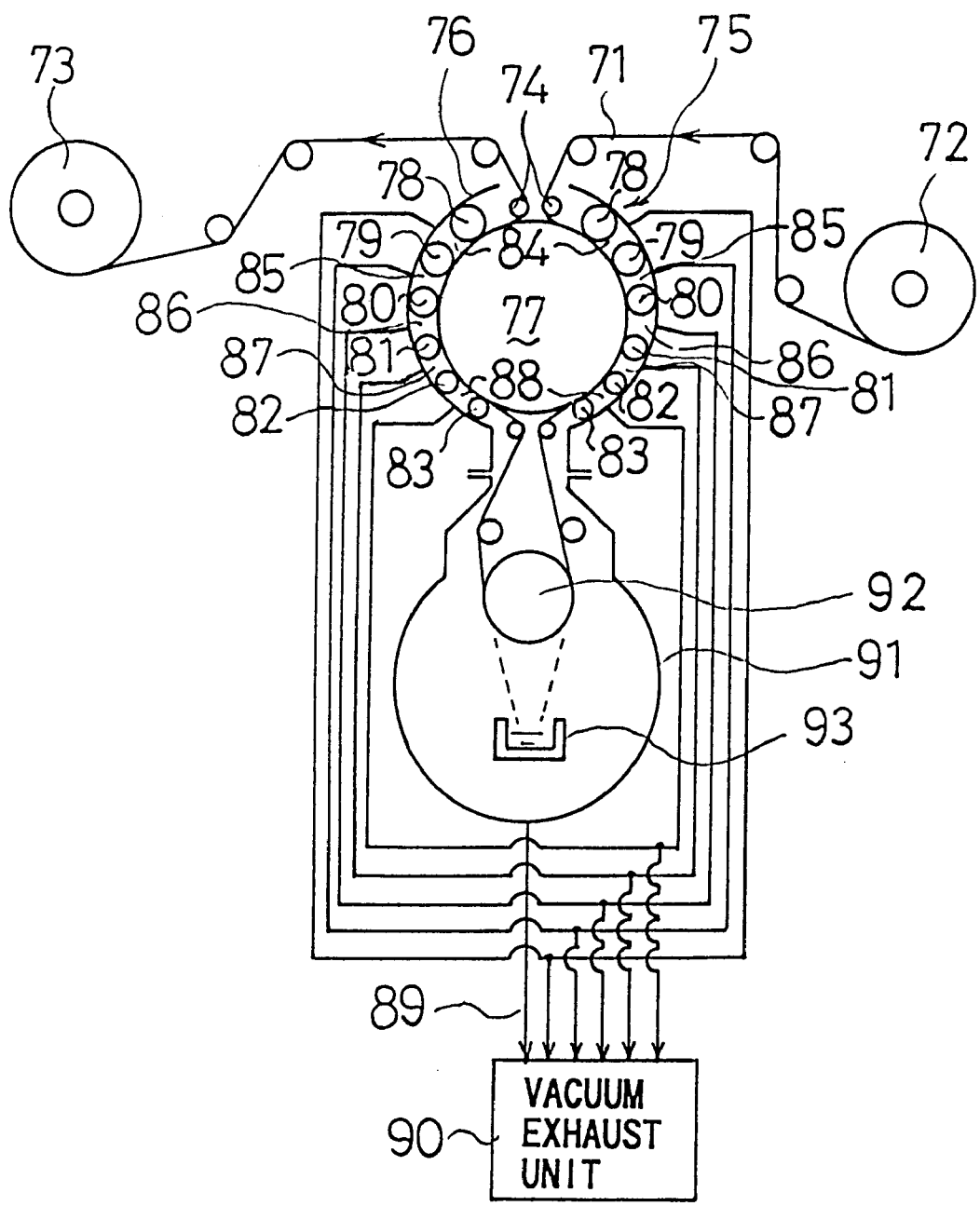
FIG. 11 is a schematic view of the entire arrangement of a conventional continuous vacuum processing apparatus.

A gate valve 60 according to another embodiment of the present invention will be described referring to FIGS. 8 to 10. The gate valve 60 comprises a top-opened valve case 61 and a cover 62 closing the valve case 61 airtightly. Also, a lower valve member 63 having a substantially L shape in cross section is disposed in the valve case 61. One leg of the L-shaped valve member 63 is directly joined in seal relationship to the inner side of one wall of the valve case 61 and has an inclined projection 70 formed on the corner end thereof. An upper valve member 64 is mounted above the lower valve member 63 so that it can move upward and downward along the leg of the lower valve member 63. The lower side of the upper valve member 64 is tailored to match the upper side of another leg of the lower valve member 63 and the upper side of the inclined projection 70. A resilient sealer 65 made of soft rubber is bonded to or formed integral with the lower side of the upper valve member 64. The upward and downward movement of the upper valve member 64 is performed by a shaft 66 which is fixedly joined at the upper end to an air cylinder (not shown) and at the lower end to the upper valve member 64. A spacer 67 is provided between the lower valve member 63, the upper valve member 64, and the opposite wall of the valve case 61. The running film 1 runs through a passage 68 which extends, from right to left in FIG. 8, across the one wall of the valve case 61 and the inclined projection 70, on the other leg of the lower valve member 63, and across the spacer 67 and the opposite wall of the valve case 61. The resilient sealer 65 has an annular rib 69 formed on the lower side thereof as shown in FIG. 9 for creating a closed space in parallel to and increasing the sealing effect between the lower side of the upper valve member 64, the leg and the inclined projection 70 of the lower valve member 63. The cross section of the annular rib 69 is smaller than the interval between any two adjacent workpieces 2 taped down on the running film 1. Although the annular rib 69 is formed in a circle in this embodiment, it may be formed of two or more concentric circles.

In this embodiment, the forwarding movement of the running film 1 carried out in the same manner as of the previous embodiment shown in FIG. 1 is so controlled that the annular rib 69 of the resilient sealer 65 locates between the two adjacent workpieces 2 to be processed. More specifically, it is designed that the annular rib 69 holds down the running film 1 without touching the two adjacent workpieces 2, as shown in FIG. 10A, hence performing the same sealing action as of the gate valve 20 of FIGS. 5 and 6. The soft rubber used as the resilient sealer 65 of this embodiment is driven by a separate pressing drive force, as compared with the resilient sealer 25 of the previous embodiment which is driven directly by the compressed air. The advantage of the second embodiment is that the resilient sealer 65 with the annular rib 69 is simpler in shape and fabricated with much ease and can perform the sealing action without direct contact with the workpieces 2 to be processed. It is also possible that the resilient sealer 25 of the previous embodiment is provided with a similar projection for producing the same sealing effect without touching the workpieces 2 taped on the running film 1.

It is understood that the present invention is not limited to the prescribed embodiments and various changes and modifications in shape, size, and location may be made.

As set forth above, the continuous vacuum processing apparatus of the present invention comprises more than two pressure reducing chambers located in series on both the upstream and the downstream of a vacuum processing unit respectively. Each of the pressure reducing chambers includes a film conveying means, a vacuum exhausting means, and a gate valve provided with a resilient member for closely holding down the running film to seal off the vacuum state of a belt-like passage of the gate valve. Accordingly, the vacuum state in the continuous vacuum processing apparatus will be maintained to a desired level. While the running film is being conveyed by the film conveying means of the pressure reducing chambers, one pair of the gate valves at the first and second stages are actuated alternately for opening and closing after vacuum evacuation, hence ensuring a high level of the vacuum state. This allows a row of the workpieces taped down on the running film to be processed continuously. In addition, as the gate valve is simple in construction, the number of the pressure reducing chambers is reduced. Therefore, the overall arrangement of the apparatus will be compact in size minimizing the exhausting volume, the cost of production, and the space of installation.

When the resilient member in the gate valve for sealing has a pressurizing space provided in the interior thereof for introducing a pressurized fluid and is arranged to face the passage of the running film, the passage will easily be closed and opened by introducing and discharging the pressurized fluid.

The gate valve comprises a lower valve member composed of two regions, one located at the entrance side through which the passage for the running film extends and the other located at the opposite side on which the passage extends, and provided with a inclined projection formed between the two regions, an upper valve member arranged movable vertically with respect to the lower valve member so that its lower side opposes to the other region of the lower valve member and the upper side of the inclined projection, and a resilient member mounted to the lower side of the upper valve member. This allows the passage to be closed and opened by the vertical movement of the upper valve member. Also, when the one region of the lower valve member is sealed, the sealing between the upper and lower valve members will be maintained.

Since the resilient member has a rib portion provided on the lower side thereof which is arranged to face the passage, and the cross section of the rib is shaped smaller than the interval of any two adjacent workpieces taped down on the running film, the rib portion of the resilient member when lowered to between the two adjacent workpieces on the running film allows the workpieces to be protected from any stress during the sealing action.

As two or more vacuum processing units are provided in a row, they can perform the vacuum process to both sides of the workpieces on the running film in sequence. The vacuum processing unit contains a plurality of sputtering devices hence allowing multiple layers to be developed at one time.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

We claim:

1. A continuous vacuum processing apparatus for continuously vacuum processing a row of workpieces taped down on a running film, comprising;

more than two pressure reducing chambers located in series on both an upstream side and a downstream side of a vacuum processing unit respectively, each pressure reducing chamber including a film conveying means, a vacuum exhausting means, and a gate valve provided with a resilient member for holding down the running film in direct contact therewith to seal off a vacuum state of a passage, and for letting the running film pass through the gate valve.

2. A continuous vacuum processing apparatus according to claim 1, wherein the resilient member for holding down the running film has a pressurizing space provided in the interior thereof for introducing a pressurized fluid and is arranged to face the passage of the running film.

3. A continuous vacuum processing apparatus according to claim 1, wherein the gate valve comprises a lower valve member composed of two regions, a first region located at an entrance side through which the passage for the running film passes and a second region located at the opposite side on which the passage extends, and provided with a projection formed between the two regions, an upper valve member arranged movable vertically with respect to the lower valve member so that its lower side opposes to the second region of the lower valve member and an upper side of the projection, and the resilient member mounted on a lower side of the upper valve member.

4. A continuous vacuum processing apparatus according to claim 1, wherein the resilient member has a rib portion provided on a lower side thereof arranged to face the passage, a cross section of the rib shaped smaller than an interval of a two adjacent workpieces taped down on the running film.

5. A continuous vacuum processing apparatus according to claim 1, wherein two or more vacuum processing units are provided.

6. A continuous vacuum processing apparatus according to claim 1, wherein the vacuum processing unit contains a plurality of sputtering devices.

7. A film deposition apparatus for a plurality of workpieces comprising:

a carrier web for sequentially supporting spaced workpieces mounted on the carrier web;

means for moving the carrier web;

a film deposition assembly operatively receiving the carrier web for depositing a film on the workpieces; and sealing members mounted on the entrance and exit path of the film deposition assembly and include a first housing having a first flexible sealing member for clamping and sealing the carrier web, a second housing having a second flexible sealing member for clamping and sealing the carrier web and an intermittent control space member for accumulating a portion of the carrier web wherein the first and second flexible sealing members sequentially clamp and release a length of the carrier web that can be stored within the intermittent control space member whereby an operative vacuum for the film deposition assembly can be maintained.

8. A continuous vacuum processing apparatus for continuously vacuum processing a row of workpieces attached on a running film, comprising:

more than two pressure reducing chambers located in series on both an upstream side and a downstream side of a vacuum processing unit respectively, each pressure reducing chamber including a film conveying means for conveying the running film, a vacuum exhausting means, and a gate valve provided with a resilient member for holding down the running film to seal off a vacuum state of an openable passageway of the gate valve, wherein the resilient member in the gate valve for sealing has a pressurizing space provided in an interior thereof for introducing a pressurized fluid and is arranged to face the openable passageway.

9. A continuous vacuum processing apparatus according to claim 8, wherein the gate valve comprises a lower valve member composed of two regions, a first region located at an entrance side through which the openable passageway for the running film passes and a second region located at the opposite side on which the openable passageway extends, and provided with a projection formed between the two regions, an upper valve member arranged to move vertically with respect to the lower valve member so that its lower side is opposite to the second region of the lower valve member and an upper side of the projection, and the resilient member is mounted to a lower side of the upper valve member.

10. A continuous vacuum processing apparatus according to claim 8, wherein the resilient member has a rib portion provided on a lower side thereof arranged to face the openable passageway, a cross section of the rib is shaped smaller than an interval of any two adjacent workpieces on the running film.

11. A continuous vacuum processing apparatus according to claim 8, wherein two or more vacuum processing units are provided between the pressure reducing chambers.

12. A continuous vacuum processing apparatus according to claim 11, wherein the vacuum processing units contain a plurality of sputtering devices.

13. A film deposition apparatus for a plurality of workpieces comprising:

a carrier web for sequentially supporting spaced workpieces mounted on the carrier web;

means for moving the carrier web;

a film deposition assembly which operatively receives the carrier web for depositing a film on the workpieces; and sealing members movably mounted respectively on an upstream side of the film deposition assembly and a downstream side of the film deposition assembly, the sealing members directly contact and seal against the carrier web between the spaced workpieces to isolate the film deposition assembly and subsequently release the carrier web to permit movement of workpieces into the film deposition assembly whereby the film can be continuously applied to workpieces on the carrier web.

* * * * *